US012615789B1

(12) United States Patent
Chen et al.

(10) Patent No.: US 12,615,789 B1
(45) Date of Patent: Apr. 28, 2026

(54) BIPOLAR TRANSISTOR STRUCTURE AND RADIO FREQUENCY AMPLIFIER

(71) Applicant: XIAMEN SAN'AN INTEGRATED CIRCUIT CO., LTD., Xiamen (CN)

(72) Inventors: Zhangzhi Chen, Xiamen (CN);
Zhiming Liao, Xiamen (CN);
Xiangyang He, Xiamen (CN);
Houngchi Wei, Xiamen (CN);
ChiaChu Kuo, Xiamen (CN)

(73) Assignee: XIAMEN SAN'AN INTEGRATED CIRCUIT CO., LTD., Xiamen (CN)

( * ) Notice: Subject to any disclaimer, the term of this patent is extended or adjusted under 35 U.S.C. 154(b) by 0 days.

(21) Appl. No.: 19/244,569

(22) Filed: Jun. 20, 2025

(30) Foreign Application Priority Data

Oct. 24, 2024 (CN) .......................... 202411488046.2

(51) Int. Cl.
*H01L 21/77* (2017.01)
*H03F 3/195* (2006.01)
(Continued)

(52) U.S. Cl.
CPC ........... *H10D 10/821* (2025.01); *H03F 3/195* (2013.01); *H10D 10/021* (2025.01);
(Continued)

(58) Field of Classification Search
CPC .. H10D 10/821; H10D 10/021; H10D 62/137; H10D 64/281; H10D 84/615; H03F 3/195
(Continued)

(56) References Cited

U.S. PATENT DOCUMENTS 5,447,893 A * 9/1995 Zank ...................... C04B 35/571
501/87
5,949,097 A * 9/1999 Hirata .................... H10D 84/01
257/E29.189
(Continued)

FOREIGN PATENT DOCUMENTS

CN 115548108 A 12/2022
CN 118136654 A 6/2024

OTHER PUBLICATIONS

CNIPA, Notification of First Office Action for CN202411488046.2, Nov. 28, 2024.
(Continued)

*Primary Examiner* — Vu A Vu
(74) *Attorney, Agent, or Firm* — Hemisphere Law, PLLC

(57) ABSTRACT
A semiconductor device includes an active region, including: a semiconductor layer, having a first surface, including a collector layer, a base layer and an emitter layer sequentially stacked, and the first surface being a surface of the emitter layer facing away from the base layer; an emitter mesa and an emitter electrode sequentially disposed on the emitter layer; a first dielectric layer, covering a top surface of the emitter electrode, extending along a side surface of the emitter electrode to cover part of the first surface exposed outside the emitter electrode, and defining a first opening; a second dielectric layer, covering the first dielectric layer, and defining a second opening connected to the first opening; and a base electrode, connected to the base layer through the first opening and the second opening, and extending to cover at least part of the second dielectric layer adjacent to the second opening.

11 Claims, 9 Drawing Sheets

First direction

(51) Int. Cl.
| | |
|---|---|
| *H10D 10/01* | (2025.01) |
| *H10D 10/80* | (2025.01) |
| *H10D 62/13* | (2025.01) |
| *H10D 64/27* | (2025.01) |
| *H10D 84/60* | (2025.01) |

(52) U.S. Cl.
CPC ......... *H10D 62/137* (2025.01); *H10D 64/281* (2025.01); *H10D 84/615* (2025.01)

(58) Field of Classification Search
USPC ........................................................ 257/197
See application file for complete search history.

(56) References Cited

U.S. PATENT DOCUMENTS

| | | | | |
|---|---|---|---|---|
| 5,962,880 A * | 10/1999 | Oda | ...................... | H10D 62/177 |
| | | | | 250/214 A |
| 6,744,115 B2 * | 6/2004 | Sasaki | ................. | H10D 10/054 |
| | | | | 257/349 |
| 7,842,973 B2 * | 11/2010 | Miura | ................... | H10D 10/891 |
| | | | | 257/E29.189 |
| 2024/0079473 A1 * | 3/2024 | John | .................... | H10D 10/891 |
| 2025/0081555 A1 * | 3/2025 | Zhou | .................... | H10D 62/184 |

OTHER PUBLICATIONS

Xiamen Sanan Integrated Circuit Co., Ltd. (Applicant), Replacement claims (allowed) of CN202411488046.2, Jan. 7, 2025.
CNIPA, Notification to grant patent right for invention in CN202411488046.2, Jan. 13, 2025.

* cited by examiner

First direction

First direction

First direction

First direction

Second direction

First direction

First direction

First direction

BIPOLAR TRANSISTOR STRUCTURE AND RADIO FREQUENCY AMPLIFIER

CROSS-REFERENCE TO RELATED APPLICATION

This application claims priority to Chinese Patent Application No. 202411488046.2, filed on Oct. 24, 2024, which is herein incorporated by reference in its entirety.

TECHNICAL FIELD

The disclosure relates to the technical field of semiconductors, and more particularly to a bipolar transistor structure and a radio frequency amplifier.

BACKGROUND

Bipolar transistors are commonly known as triodes. With the development of technology, people have put forward higher and higher requirements on the frequency characteristics of the triodes. Taking heterojunction bipolar transistor (HBT) as an example, a junction capacitance between a base layer and a collector layer (BC junction capacitance, $C_{bc}$) is one of the important factors affecting the frequency characteristics. The frequency characteristics of the triode are negatively correlated with the BC junction capacitance. Therefore, how to reduce the BC junction capacitance to improve the frequency characteristics of the triode is a problem of concern in the industry.

SUMMARY

Therefore, in order to overcome at least part defects in the related art, embodiments of the disclosure provide a bipolar transistor structure (i.e., semiconductor device) and a radio frequency amplifier, which are conducive to shrinking the device and reducing an area of a BC junction, thereby improving frequency characteristics of the device.

An embodiment of the disclosure provides a semiconductor device (i.e., bipolar transistor structure), including an active region, and the active region includes a semiconductor layer, an emitter mesa, an emitter electrode, a first dielectric layer, a second dielectric layer, and a base electrode.

The semiconductor layer has a first surface, the semiconductor layer includes a collector layer, a base layer and an emitter layer sequentially stacked in that order. The first surface is a surface of the emitter layer facing away from the base layer. The emitter mesa is disposed on the emitter layer. The emitter electrode is disposed on the emitter mesa. The first dielectric layer covers a top surface of the emitter electrode, and extends along a side surface of the emitter electrode to cover a part of the first surface exposed outside the emitter electrode. The first dielectric layer defines a first opening. The second dielectric layer covers the first dielectric layer, and the second dielectric layer defines a second opening connected to the first opening. The base electrode is connected to the base layer through the first opening and the second opening, and extends to cover at least a part of the second dielectric layer adjacent to the second opening. A thickness of each of the first dielectric layer and the second dielectric layer is in a range of 200 angstroms (Å) to 1000 Å. A maximum width of the first opening is in a range of 0.2 microns (μm) to 1 μm, and a maximum width of the second opening is in a range of 0.2 μm to 1 μm. A minimum distance between the first opening and the emitter mesa is in a range of 0.2 μm to 1 μm.

The above embodiment of the disclosure at least has one or more of the following beneficial effects. Through the structure of the disclosure, a distance between the base electrode and the emitter mesa can be made smaller when an effective spacing between the base electrode and the emitter mesa and other dimensions remain unchanged. That is, even if a distance between a part of the base electrode located above the second dielectric layer and the emitter structure is reduced, an appropriate effective spacing between the base electrode and the emitter mesa can still be maintained. Therefore, while maintaining the appropriate effective spacing between the base electrode and the emitter mesa, an area of the base mesa of the semiconductor device provided by the embodiment of the disclosure can be made smaller, and the area of the BC junction is smaller, thus the frequency characteristics can be improved.

DETAILED DESCRIPTION OF EMBODIMENTS

An embodiment of the disclosure provides a semiconductor device 100 (i.e., bipolar transistor structure), the semiconductor device 100 is a triode structure having a semiconductor stack structure, for example, an HBT device, or an integrated HBT device (a passive device is integrated on the HBT device).

Figure 1A:
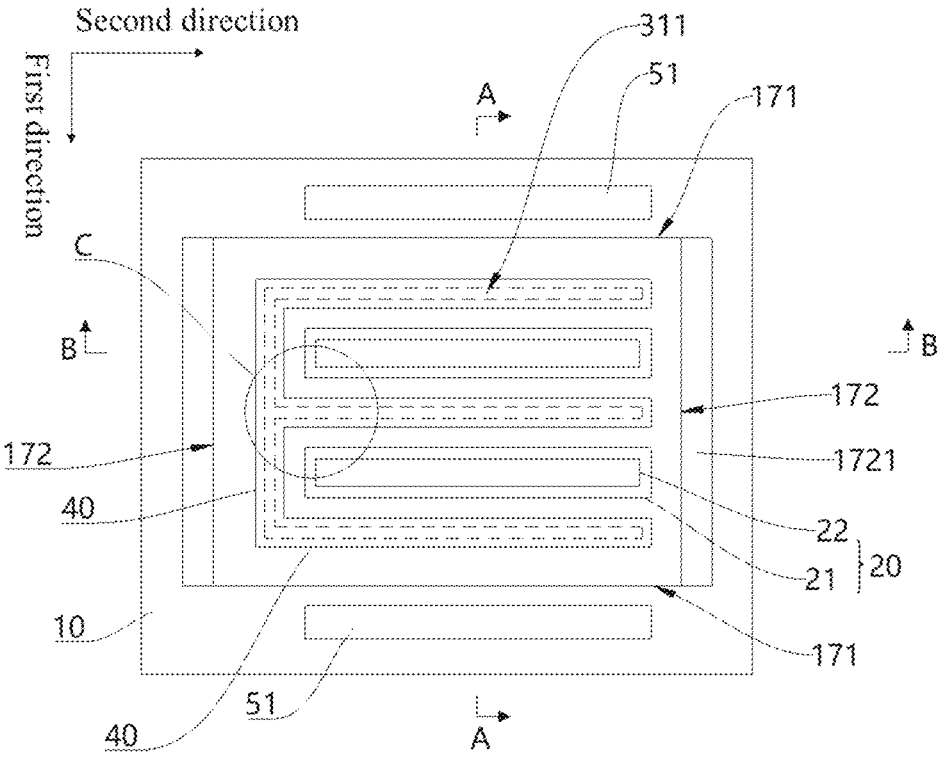
FIG. 1A illustrates a schematic structural diagram from a perspective of a top view of an active region of a semiconductor device according to an embodiment of the disclosure.
Figure 1B:
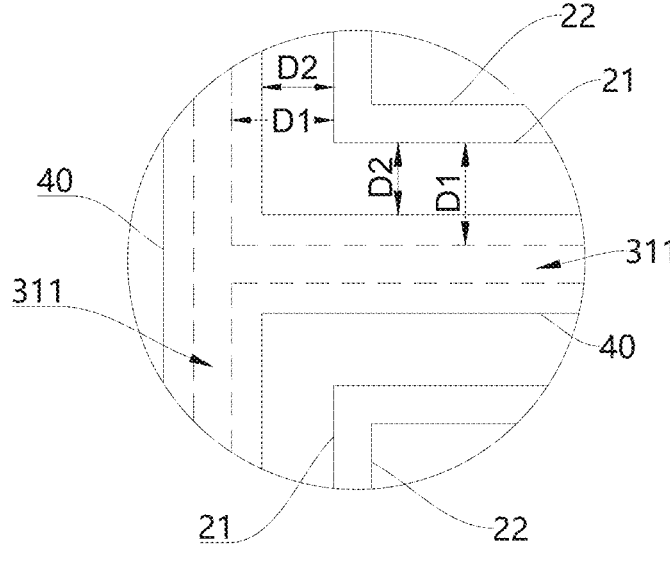
FIG. 1B illustrates a schematic partially enlarged diagram of a C area in FIG. 1A.
Figure 2:
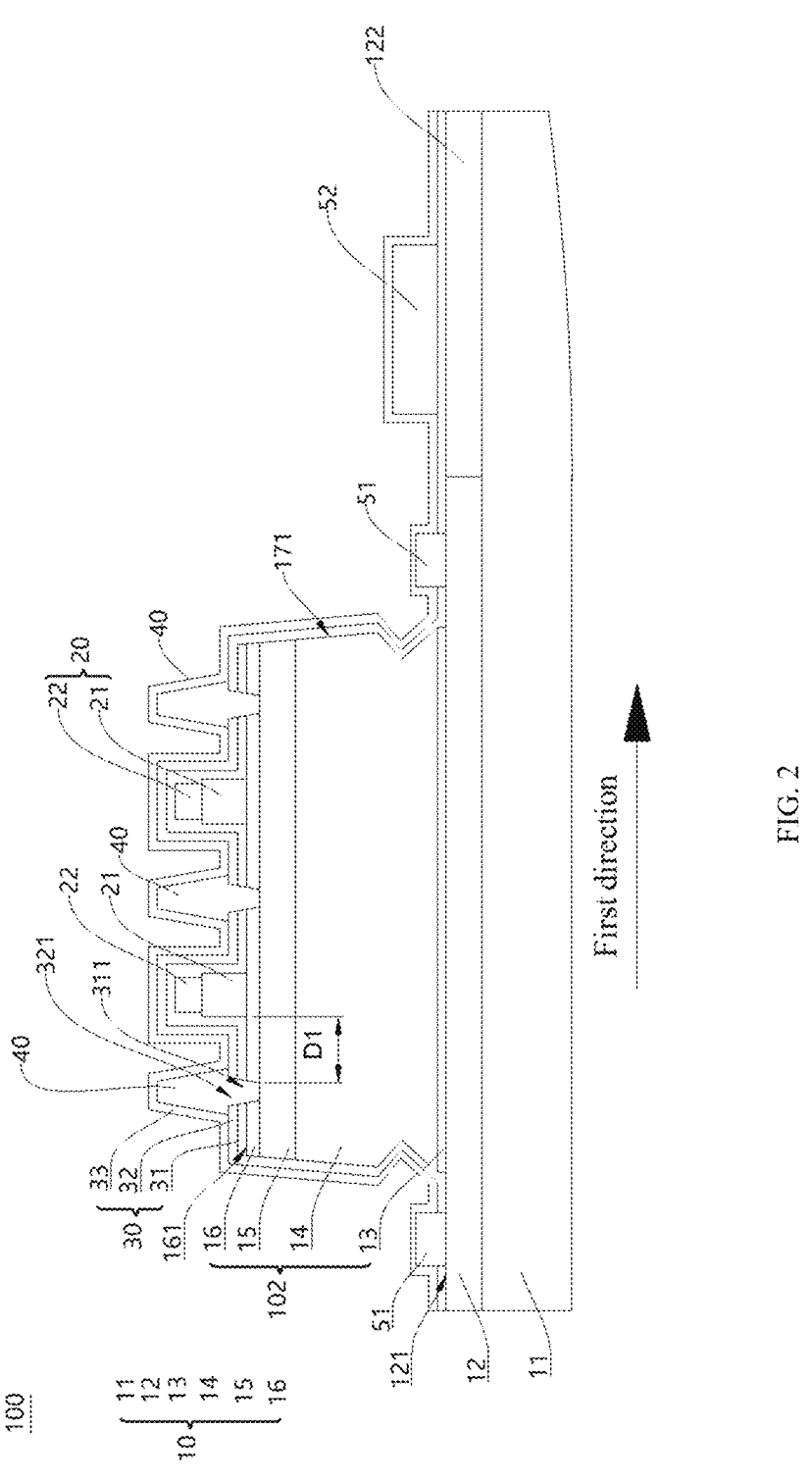
FIG. 2 illustrates a schematic sectional diagram of the semiconductor device according to an embodiment of the disclosure along an A-A direction in FIG. 1A.

Referring to FIG. 1A, the semiconductor device 100 includes an active region. FIG. 2 illustrates a schematic sectional diagram of the semiconductor device according to an embodiment of the disclosure along an A-A direction in FIG. 1A, and FIG. 2 further illustrates a passive region part in the semiconductor device 100. In order to show some structures in the semiconductor device 100 more clear, FIG. 1A omits a first dielectric layer 31, a second dielectric layer 32 and a third dielectric layer 33, and marks a position of a first opening 311 with a dotted line. The active region in the semiconductor device 100 includes a semiconductor layer 10, an emitter electrode 22, dielectric layers 30 and a base electrode 40. The semiconductor layer 10 has a first surface 161, and the semiconductor layer 10 includes a collector layer 14, a base layer 15 and an emitter layer 16 sequentially stacked in that order. The first surface is a surface of the emitter layer 16 facing away from the base layer 15. The emitter electrode 22 is disposed on the emitter layer 16. Specifically, an emitter structure 20 is disposed on a part area on the first surface 161, and the emitter structure 20 includes an emitter mesa 21 and an emitter electrode 22 sequentially stacked in that order. That is, the emitter mesa 21 is disposed on the emitter layer 16, and the emitter electrode 22 is disposed on the emitter mesa 21. It should be noted that although a width of the emitter electrode 22 is smaller than a width of the emitter mesa 21 shown in FIG. 1A to FIG. 11, the embodiment is not limited to this. In some embodiments, the width of the emitter electrode 22 can be equal to or substantially consistent with the width of the emitter mesa 21. In the embodiment, the emitter mesa 21 mainly includes an indium gallium arsenide (InGaAs) layer and a gallium arsenide (GaAs) layer. specifically, the InGaAs layer is a cap layer, and used for ohmic contact of the emitter electrode. The GaAs layer is used to solve the problem of lattice matching between InGaAs in the cap layer and indium gallium phosphorus (InGaP) in the emitter layer.

The dielectric layers 30 include a first dielectric layer 31 and a second dielectric layer 32. The first dielectric layer 31 covers a top surface of the emitter electrode 22, and extends along a side surface of the emitter electrode to cover a part of the first surface 161 exposed outside the emitter electrode 22. The first dielectric layer 31 defines a first opening 311. The second dielectric layer 32 covers the first dielectric layer 31. The second dielectric layer 32 defines a second opening 321 connected to the first opening 311.

The base electrode 40 is connected to the base layer 15 through the first opening 311 and the second opening 321. The base electrode 40 extends to cover at least a part of the second dielectric layer 32 adjacent to the second opening 321.

The semiconductor layer 10, for example, further includes a substrate 11, a subcollector layer 12 and an etching stop layer 13 sequentially stacked in that order. The collector layer 14 is disposed on the etching stop layer 13.

A material of the substrate 11, for example, may be a III-V semiconductor, such as any one or a combination of multiple of gallium nitride (GaN), aluminum gallium nitride (AlGaN), aluminum nitride (AlN), GaAs, aluminum gallium arsenide (AlGaAs), indium phosphorus (InP), InGaAs, and indium aluminum arsenide (InAlAs).

A material of the subcollector layer 12, for example, may be a III-V semiconductor, such as any one or a combination of multiple of GaN, AlGaN, AlN, GaAs, AlGaAs, InP, InGaAs, and InAlAs.

A material of the etching stop layer 13, for example, may be a III-V semiconductor, such as any one or a combination of multiple of InGaP, InGaAs, gallium arsenide phosphorus (GaAsP), AlGaAs, InAlAs and gallium antimony (GaSb).

A material of the collector layer 14, for example, may also be a III-V semiconductor, such as any one or a combination of multiple of GaN, AlGaN, AlN, GaAs, AlGaAs, InP, InGaAs, and InAlAs.

A material of the base layer 15, for example, may also be a III-V semiconductor, such as any one or a combination of multiple of GaN, AlGaN, AlN, GaAs, AlGaAs, InP, InGaAs, and InAlAs.

A material of the emitter layer 16, for example, may also be a III-V semiconductor, such as any one or a combination of multiple of GaN, AlGaN, AlN, GaAs, AlGaAs, InP, InGaAs, InAlAs, and InGaP. The emitter layer 16 can be a multilayer structure.

A doped type of each of the subcollector layer 12, the collector layer 12 and the emitter layer 16 is a first doped type, and a doped type of the base layer 15 is a second doped type. When the first doped type is n-type, the second doped type is p-type. When the first doped type is p-type, the second doped type is n-type.

Materials of the dielectric layers 30 may be any one or a combination of insulating materials such as silicon nitride (SiN), silicon nitride ($Si_3N_4$), disilicon trinitride ($Si_2N_3$), silicon dioxide ($SiO_2$), silicon oxynitride (SiON), aluminum oxide ($Al_2O_3$), AlN, polyimide (PI), benzocyclobutene (BCB) and polybenzoxazole (PBO). The materials of the first dielectric layer 31 and the second dielectric layer 32 can be the same or different, and thicknesses of the first dielectric layer 31 and the second dielectric layer 32 can be the same or different. In some embodiments, the thickness of each of the first dielectric layer 31 and the second dielectric layer 32 is in a range of 200 Å to 1000 Å ($1 Å=10^{-10}$ meters abbreviated as m). In some embodiments, at least one of the materials and the thicknesses of the first dielectric layer 31 and the second dielectric layer 32 is different. For example, the materials of the first dielectric layer 31 and the second dielectric layer 32 are the same, but the thicknesses are different. For example, the materials of the first dielectric layer 31 and the second dielectric layer 32 are different, but the thicknesses are the same. For example, both of the materials and the thicknesses of the first dielectric layer 31 and the second dielectric layer 32 are different.

The emitter electrode 22 and the base electrode 40 are conductive metal materials. The emitter electrode 22, for example, may be titanium (Ti), platinum (Pt), gold (Au), aluminum (Al), copper (Cu), tungsten (W), nickel (Ni), and germanium (Ge). The base electrode 40, for example, may be a Pt/Ti/Pt/Au/Ti stack layer.

As shown in FIG. 2, a part of the base electrode 40 is connected to the base layer 15 through the first opening 311 and the second opening 321, and a part of the base electrode 40 located above the second dielectric layer 32 extends outside an edge of the second opening 321, and covers a part of the second dielectric layer 32 adjacent to the second opening 321. It can be also understood that a width of the base electrode 40 is greater than widths of the first opening 311 and the second opening 321. When the width of the base electrode 40 is an uneven width, at least a width of an interface of the base electrode 40 in contact with the second dielectric layer 32 is greater than a maximum width of the first opening 311.

Specifically, a width of the part of the base electrode 40 located above the second dielectric layer 32 is greater than a width of the base electrode 40 in contact with the base layer 15. Referring to FIG. 1B and FIG. 2, D1 represents an effective spacing between the base electrode 40 and the emitter mesa 21, and the meaning of D1 is a distance between a contact part of the base electrode 40 and the base layer 15 and the emitter mesa 21. Through the structure of the disclosure, the distance D2 between the base electrode 40 (the part above the second dielectric layer 32) and the emitter mesa 21 can be made smaller when the effective spacing between the base electrode 40 and the emitter mesa 21 and other dimensions remain unchanged. For example, D1 may be in a range of 0.2 μm to 1 μm, and D2 may be in a range of 0 μm to 1 μm. A difference between D1 and D2 is in a range of 0.1 μm to 1 μm. That is, even if the distance between the part of the base electrode 40 located above the second dielectric layer 32 and the emitter structure 20 is reduced, the appropriate effective spacing between the base electrode 40 and the emitter mesa 21 can still be maintained. Therefore, while maintaining the appropriate effective spacing between the base electrode 40 and the emitter mesa 21, the area of the base mesa 102 of the semiconductor device 100 provided by the embodiment of the disclosure can be made smaller, and the area of the BC junction is smaller, thus the frequency characteristics can be improved.

The embodiment of the disclosure further provides a preparation method of a semiconductor device, which can prepare the above semiconductor device 100. The preparation method includes the following steps S1 to S3.

In step S1, an epitaxial structure is preprocessed to obtain a semiconductor layer 10. The semiconductor layer 10 has a first surface 161. The semiconductor layer 10 includes a collector layer 14, a base layer 15 and an emitter layer 16 sequentially stacked in that order. The first surface 161 is a surface of the emitter layer 16 facing away from the base layer 15. An emitter mesa 21 is disposed on the emitter layer 16. An emitter electrode 22 is disposed on the emitter mesa 21.

In step S2, a first dielectric layer 31 and a second dielectric layer 32 are sequentially formed on the semiconductor layer 10 in that order, so that the first dielectric layer 31 covers a top surface of the emitter electrode 22, and extends along a side surface of the emitter electrode 22 to cover a part of the first surface 161 exposed outside the emitter electrode 22. The second dielectric layer 32 covers the first dielectric layer 31. The first dielectric layer 31 defines a first opening 311. The second dielectric layer 32 defines a second opening 321 connected to the first opening 311.

In step S3, a base electrode 40 is formed, so that the base electrode 40 is connected to the base layer 15 through the first opening 311 and the second opening 321. The base electrode 40 extends to cover at least a part of the second dielectric layer 32 adjacent to the second opening 321.

The specific structure of the semiconductor device 100 is described in detail below in conjunction with the specific steps of the preparation method of the semiconductor device provided in a specific embodiment of the disclosure.

Figure 3:
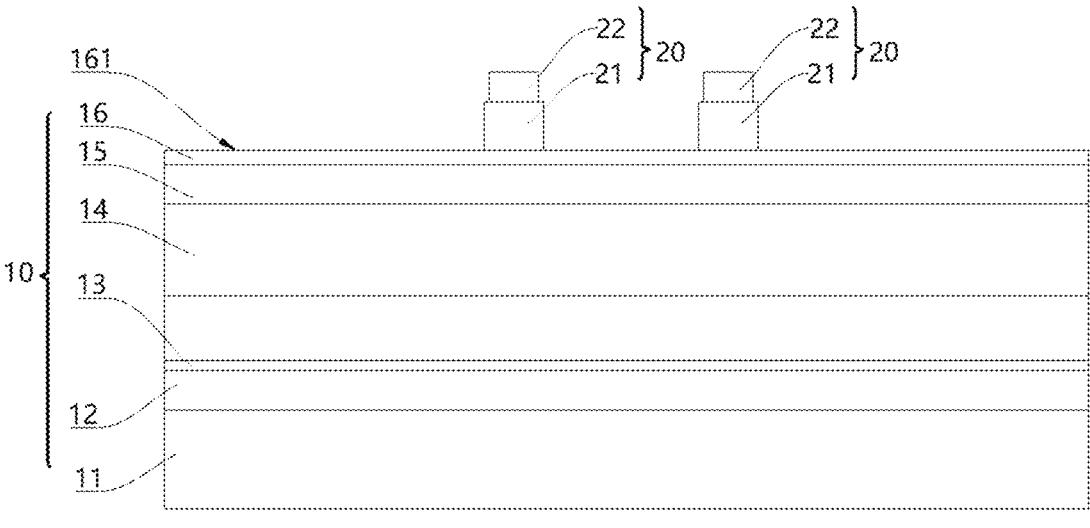
FIG. 3 illustrates a schematic structural diagram of a semiconductor layer provided in a preparation method of a semiconductor device according to an embodiment of the disclosure.

The structure of the semiconductor layer 10 obtained in step S1 is shown in FIG. 3 (corresponding to the A-A cross-sectional view), an emitter structure 20 is deposited on a part of the first surface 161, and the emitter structure 20 includes the emitter mesa 21 and the emitter electrode 22 sequentially stacked in that order.

The step S2 specifically includes step S21, step S22 and step S23.

Figure 4:
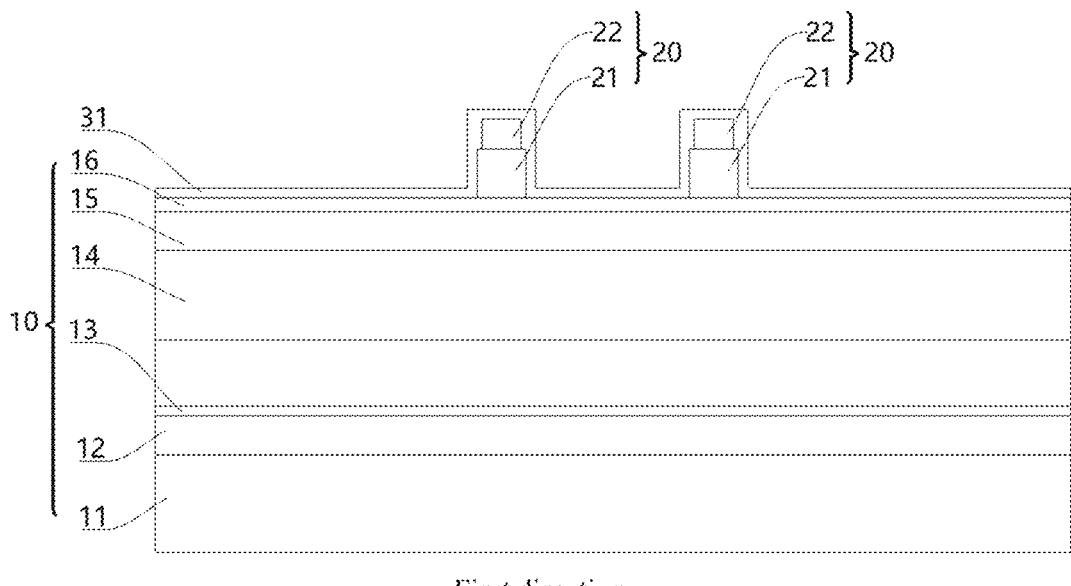
FIG. 4 illustrates a schematic structural diagram of a first dielectric layer formed on the structure shown in FIG. 3.

In step S21, the first dielectric layer 31 is formed on the semiconductor layer 10, so that the first dielectric layer 31 covers the top surface of the emitter electrode 22, and extends along the side surface of the emitter electrode 22 to cover the part of the first surface 161 exposed outside the emitter electrode 22. The structure after forming the first dielectric layer 31 in the step S21 is shown in FIG. 4 (corresponding to the A-A cross-sectional view). At this time, the first dielectric layer 31 covers the top surface of the emitter electrode 22, and cover the side surface of the emitter electrode 22, the side surface of the emitter mesa 21 and the part of the first surface 161 exposed outside the emitter electrode 22.

In step S22, the first dielectric layer 31 and the semiconductor layer 10 are etched to form a base mesa 102. The base mesa 102 has a semiconductor side surface adjacent to the first surface 161.

For example, the step S22 specifically includes step S221 and step S222.

Figure 5:
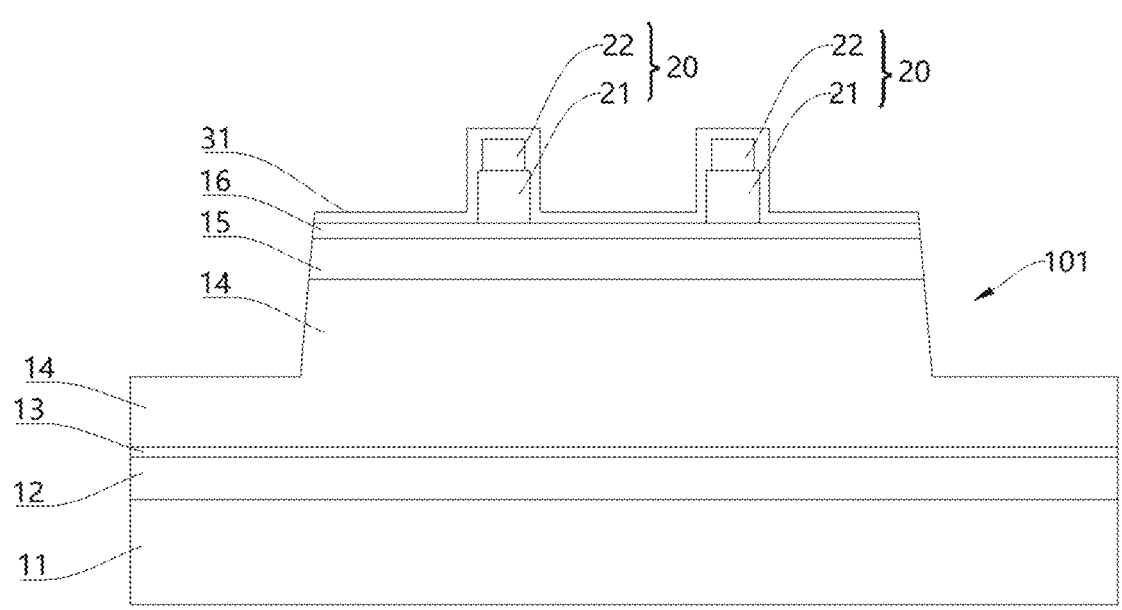
FIG. 5 illustrates a schematic structural diagram of a first etching mesa formed by using the structure shown in FIG. 4.
Figure 6:
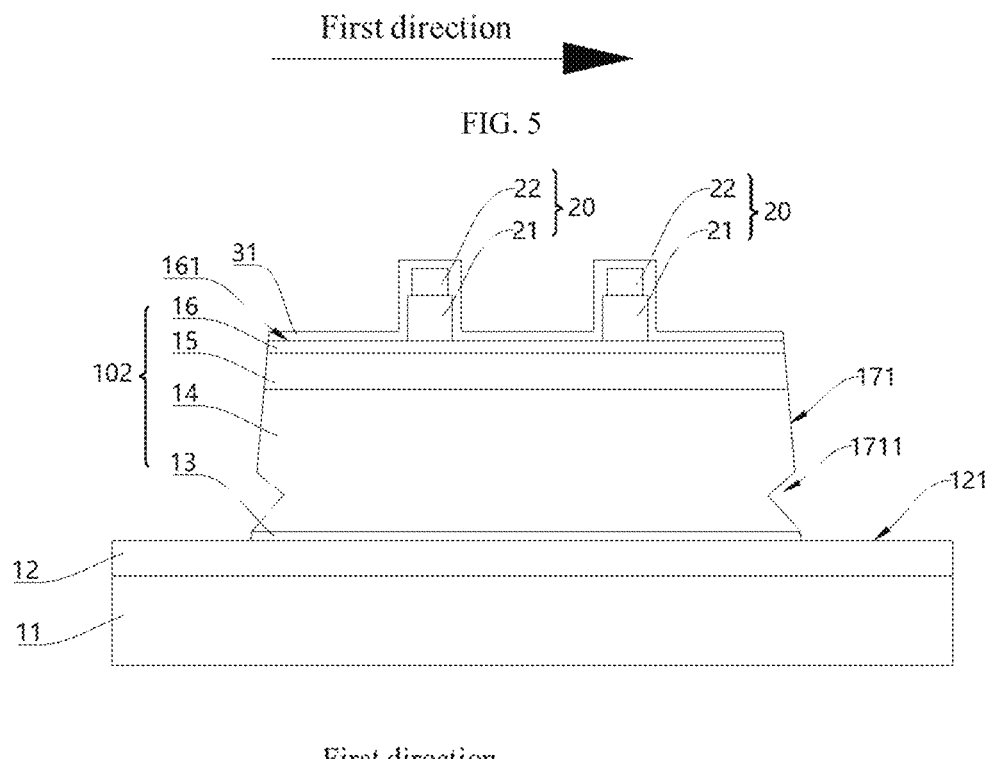
FIG. 6 illustrates a schematic structural diagram of a base mesa formed on the structure shown in FIG. 5.
Figure 7:
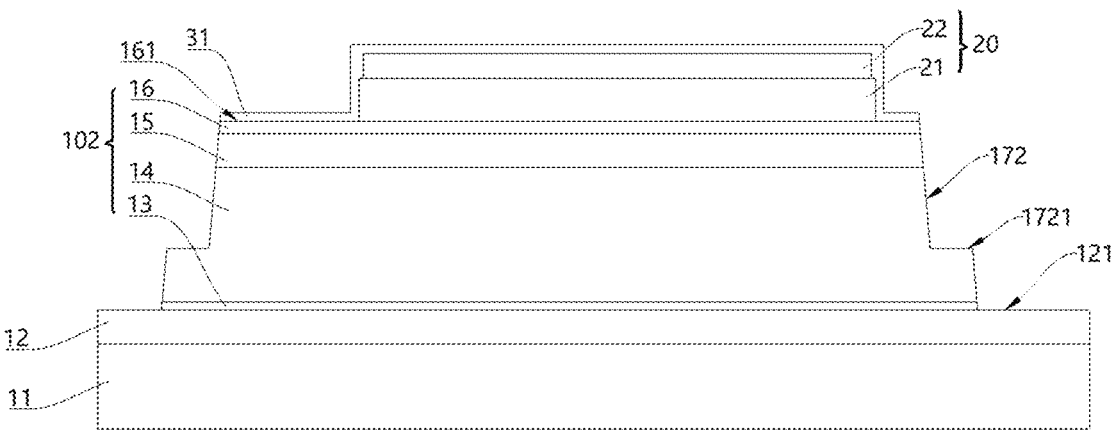
FIG. 7 illustrates a schematic structural diagram from another perspective of the structure shown in FIG. 6.

In step S221, pattern transfer is performed on the first dielectric layer 31 by using a first photoresist to form a first etching mesa (referring to FIG. 5, corresponding to the A-A cross-sectional view).

In step S222, pattern transfer is performed on the first etching mesa 101 by using a second photoresist to form the base mesa 102. A width of the second photoresist in a first direction is greater than a width of the first etching mesa 101 in the first direction, a width of the second photoresist in a second direction is greater than a width of the first etching mesa 101 in the second direction, and the first direction is intersected with the second direction.

For example, the first direction and the second direction are perpendicular to each other, and the first direction and the second direction are perpendicular to a stacking direction of each layer structure in the semiconductor layer 10. The structure of the base mesa 102 obtained in the step S222 can refer to FIG. 6 (corresponding to the A-A cross-sectional view) and FIG. 7 (corresponding to the B-B cross-sectional view), the semiconductor layer 10 has side surfaces (i.e., the semiconductor side surface) adjacent to the first surface 161. The side surfaces include two first side surfaces 171 opposite to each other in the first direction in FIG. 6, and two second side surfaces 172 opposite to each other in the second direction in FIG. 7. According to the requirements of the device structure, a width of the second photoresist in the first direction is greater than the width of the first etching mesa 101 in the first direction, so that the semiconductor layer 10 defines a recessed structure, and each of the two first side surfaces 171 defines a recessed portion 1711 located in the collector layer 14. The width of the second photoresist in the second direction is greater than the width of the first etching mesa 101 in the second direction, so that each of the two second side surfaces 172 defines a step portion 1721, which can protect the two opposite sides in the second direction, so that a wiring metal can be formed on the second side surface 172 when the wiring metal is subsequently formed, and the reliability of the metal wiring can be improved by the step portion 1721. The formation of the recessed portion 1711 removes part of the space of the PN junction in the semiconductor device 100 obtained later, so that the effect of reducing the BC junction capacitance can be achieved.

It should be noted that the two first side surfaces 171 and the two second side surfaces 172 can be inclined surfaces or vertical surfaces perpendicular to the substrate 11, which can be set according to needs, and the disclosure does not limit this. In the step S222, an etched thickness of the semiconductor layer 10 is in a range of 3000 Å to 7000 Å. Specifically, in the step S222, the collector layer 14 is continuously etched, a part of the surface of the subcollector layer 12 is exposed outside the base mesa 102, the part of the surface of the subcollector layer 12 exposed outside the base mesa 102 (the collector layer 14) may be referred to as the second surface 121 of the semiconductor layer 10.

In the above step S2, due to the presence of the first dielectric layer 31, passivation can be formed on the surface of the emitter layer 16 to protect the emitter layer 16 from being affected during the etching process, thereby improving the reliability of the structure. When the device has higher reliability, a smaller effective spacing between the base electrode 40 and the emitter mesa 21 can be designed, thereby reducing the area of the device and further reducing the area of the BC junction.

The semiconductor device 100, for example, may be an integrated transistor structure, thus the step S24 is performed after the step S22, and the subcollector layer 12 correspondingly defines an active region and a passive region 122. The base mesa 102 is located in the active region. The semiconductor device 100 includes the active region and the passive region 122, and the active region and the passive region 122 share the subcollector layer 12. Specifically, in the step S24, a photoresist can be covered on the structure formed in the step S22, the active region may be defined by a photomask and then photolithography development may be performed, the active region may be protected by the photoresist, and ion implantation may be performed on the part exposed outside the photoresist to form the passive region 122 to complete device isolation.

A step S23 is performed after the step S22 or the step S24.

Figure 8:
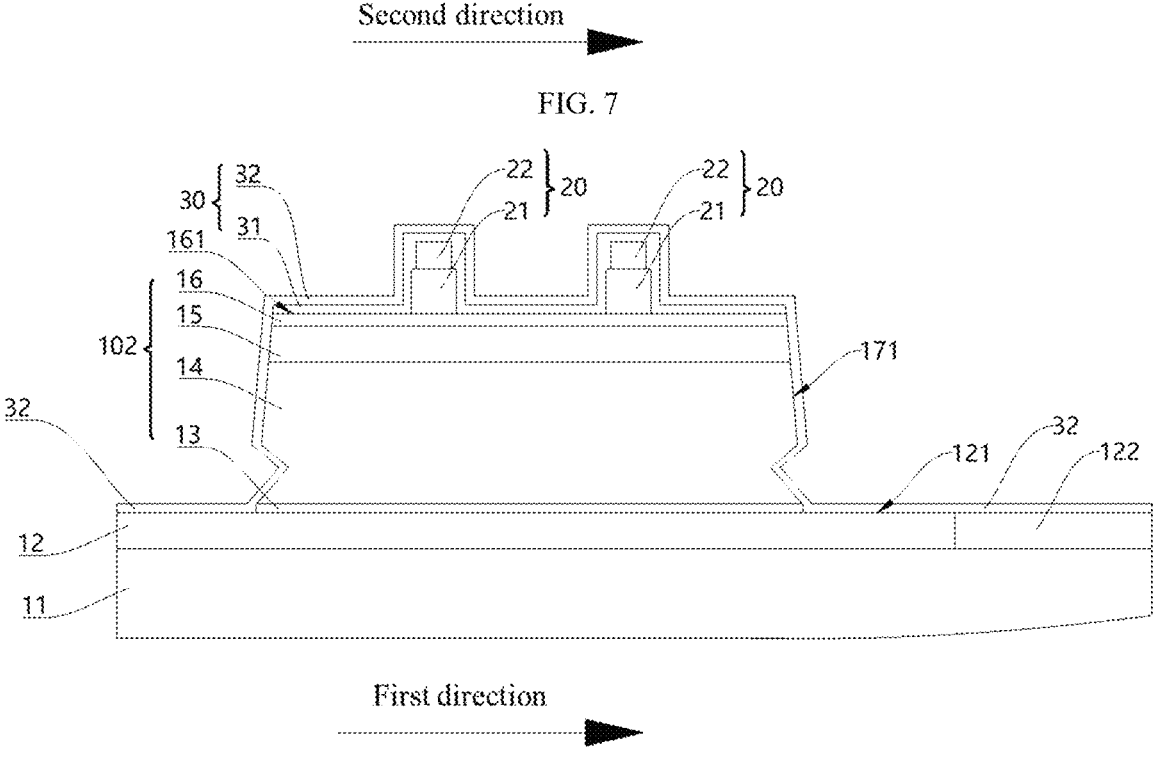
FIG. 8 illustrates a schematic structural diagram of a second dielectric layer formed on the structure shown in FIG. 6.

In step S23, the second dielectric layer 32 is formed on the base mesa 102, so that the second dielectric layer 32 covers the first dielectric layer 31 and the semiconductor side surface. Referring to FIG. 8 (corresponding to the A-A cross-sectional view), specifically, the second dielectric layer 32 covers the first dielectric layer 31, and extends to the semiconductor side surface and the second surface 121 along an edge of the first dielectric layer 31, which can achieve more comprehensive protection for the base mesa 102 and the subcollector layer 12.

The step S23 is followed by step S25, a third opening 322 is defined on an area of the second dielectric layer 32 located on the active region and located on the second surface 121. In the step S25, the first opening 311 is defined on an area of the first dielectric layer 31 located on the first surface 161, and the second opening 321 is defined on an area of the second dielectric layer 32 corresponding to the first opening 311.

Figure 9:
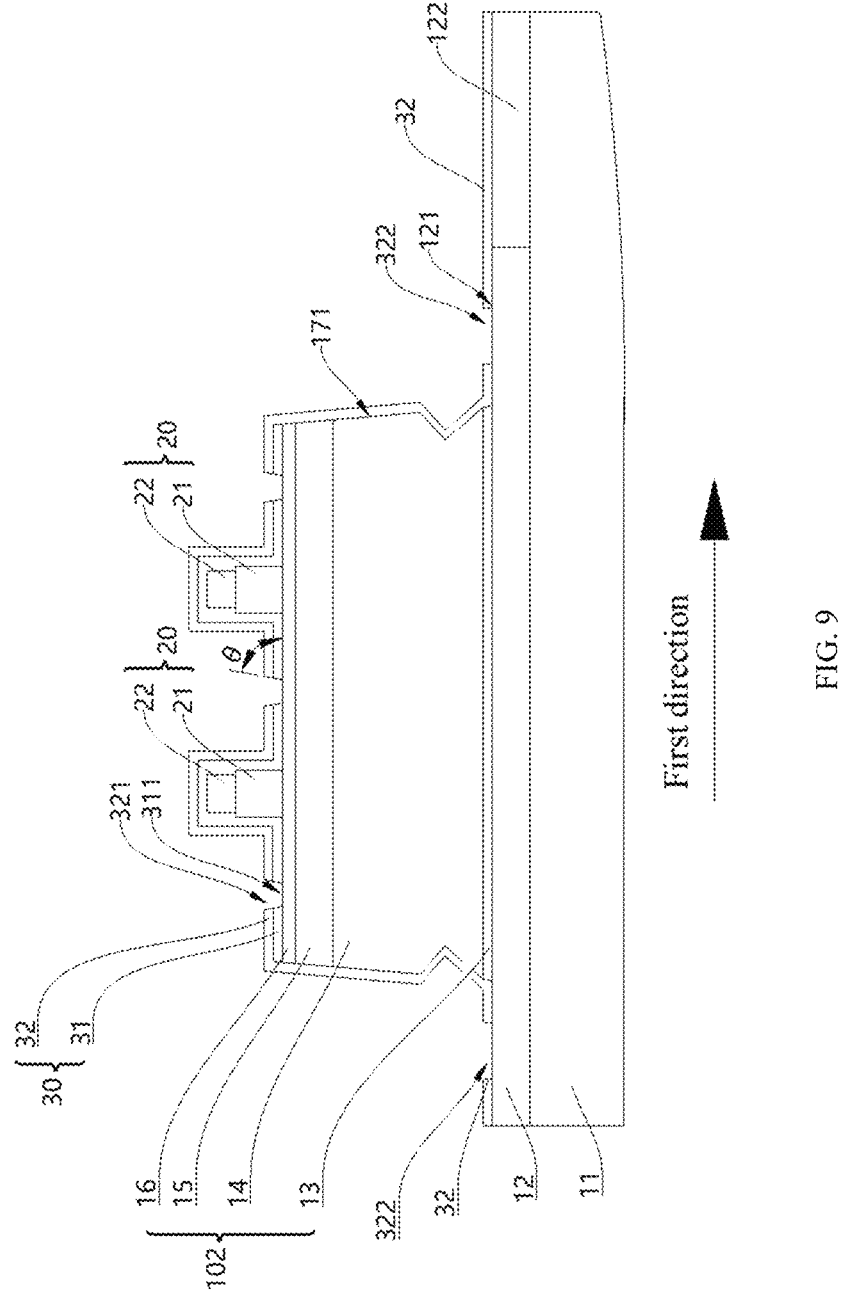
FIG. 9 illustrates a schematic structural diagram of a first opening, a second opening and a third opening defined on the structure shown in FIG. 8.

It can specifically refer to FIG. 9 (corresponding to the A-A cross-sectional view), the photomask and photoresist are used on the second dielectric layer 32, and the first opening 311, the second opening 321 and the third opening 322 can be defined synchronously by pattern transfer. In the embodiment, a maximum width of the first opening is in a range of 0.2 μm to 1 μm. A maximum width of the second opening is in a range of 0.2 μm to 1 μm. A minimum distance between the first opening and the emitter mesa 21 is in a range of 0.2 μm to 1 μm, or a distance of a width of the first opening 311 located at a contact interface between the first dielectric layer 31 and the emitter layer 16 to the emitter mesa 21 is in a range of 0.2 μm to 1 μm. A side surface of the first dielectric layer 31 facing towards the first opening 311 and a side surface of the second dielectric layer 321 facing towards the second opening 321 can be inclined surfaces or perpendicular to the first surface 161. In some embodiments, a tilt angle of a sidewall of the first dielectric layer 31 facing towards the first opening 311 is less than or equal to 90°, and a tilt angle of a sidewall of the second dielectric layer 32 facing towards the second opening 321 is less than or equal to 90°. These tilt angles refer to an angle θ between the corresponding sidewall and the first surface 161 (referring to FIG. 9). In some embodiments, the widths of the first opening 311 and the second opening 321 increase gradually in a direction from the first dielectric layer 31 to the second dielectric layer 32.

The step S3 is performed after the step S25. Specifically, in the step S3, the photomask and photoresist are used on the second dielectric layer 32, and the pattern transfer is used to deposit the base electrode material to form the base electrode 40. A part of the formed base electrode 40 is connected to the base layer 15 through the first opening 311 and the second opening 321. The base electrode 40 extends to cover at least a part of the second dielectric layer 32 adjacent to the second opening 321. Specifically, a thickness (also referred to as height) of the base electrode 40 is greater than or equal to 1000 Å, and smaller than or equal to 10000 Å. Through setting a larger height, the resistance of the base electrode 40 can be made smaller. Since the frequency characteristics of the semiconductor device 100 are also negatively correlated with the resistance of the base electrode 40, the effect of improving the frequency characteristics can also be achieved. In some embodiments, the thickness of the base electrode 40 can be designed according to actual needs. For example, the thickness of the base electrode 40 can be designed to be 3500 Å to 6500 Å when used in a radio frequency amplifier 1000 in the 5G frequency band. For example, the thickness of the base electrode 40 can be selected to be around 1000 Å when used in a radio frequency amplifier 1000 in the 2G frequency band, which can reduce the cost of the device.

In the step S3, a high-temperature treatment may be performed after the base electrode material is deposited, so that the bottom component of the base electrode material infiltrates and contacts the base layer 15, and forms a good contact with the base layer 15. Alternatively, before depositing the base electrode material, the emitter layer 16 corresponding to the first opening 311 and the second opening 321 may be removed by dry etching (using gas or plasma) or wet etching (using etching liquid), and then the base electrode material is deposited, and finally the high-temperature treatment is performed, so that the base electrode material forms a good contact with the base layer 15. Certainly, the method of forming the base electrode 40 is not limited to the above examples.

Figure 10:
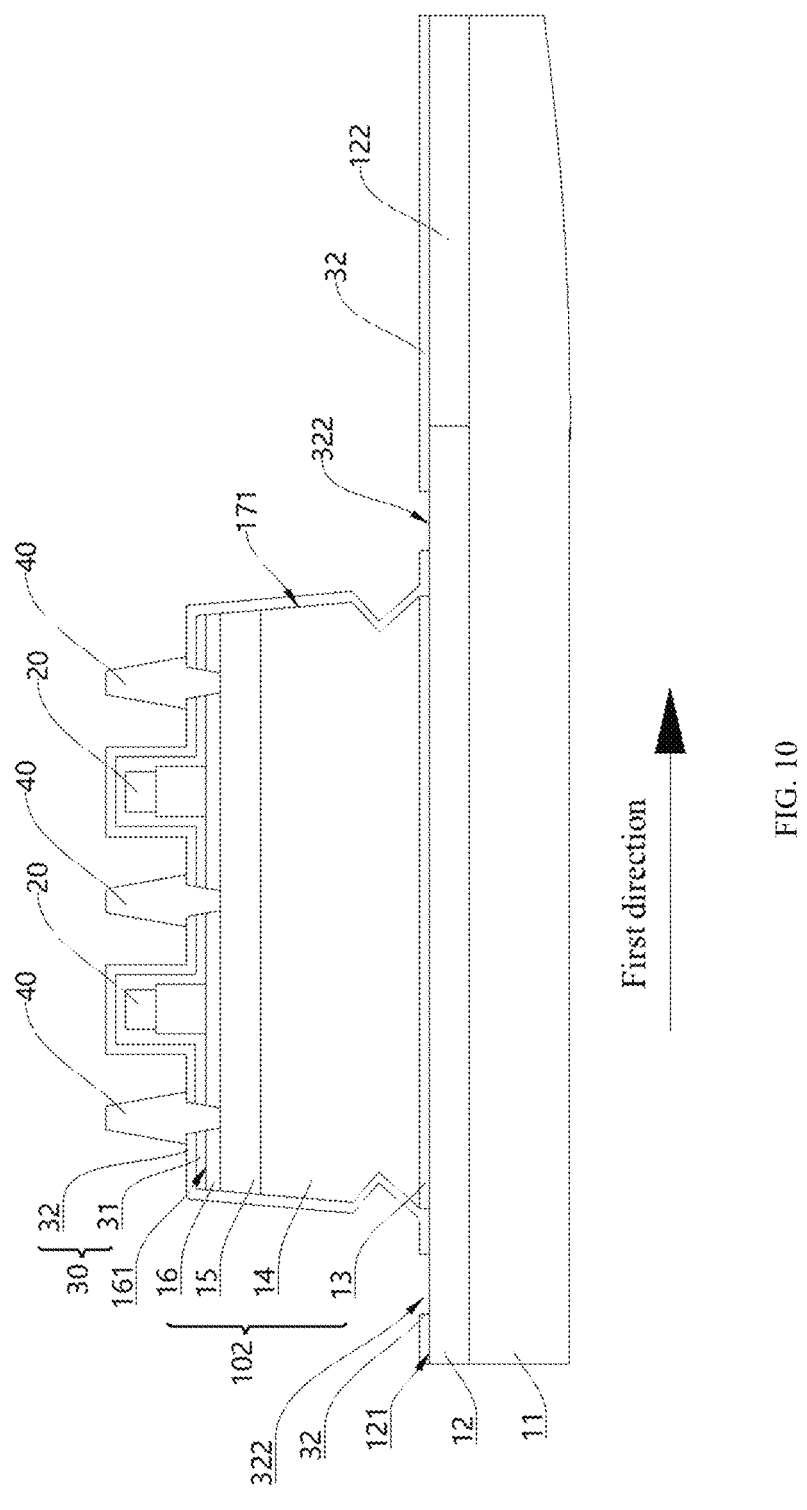
FIG. 10 illustrates a schematic structural diagram after a base electrode is formed using the structure shown in FIG. 9.
Figure 11:
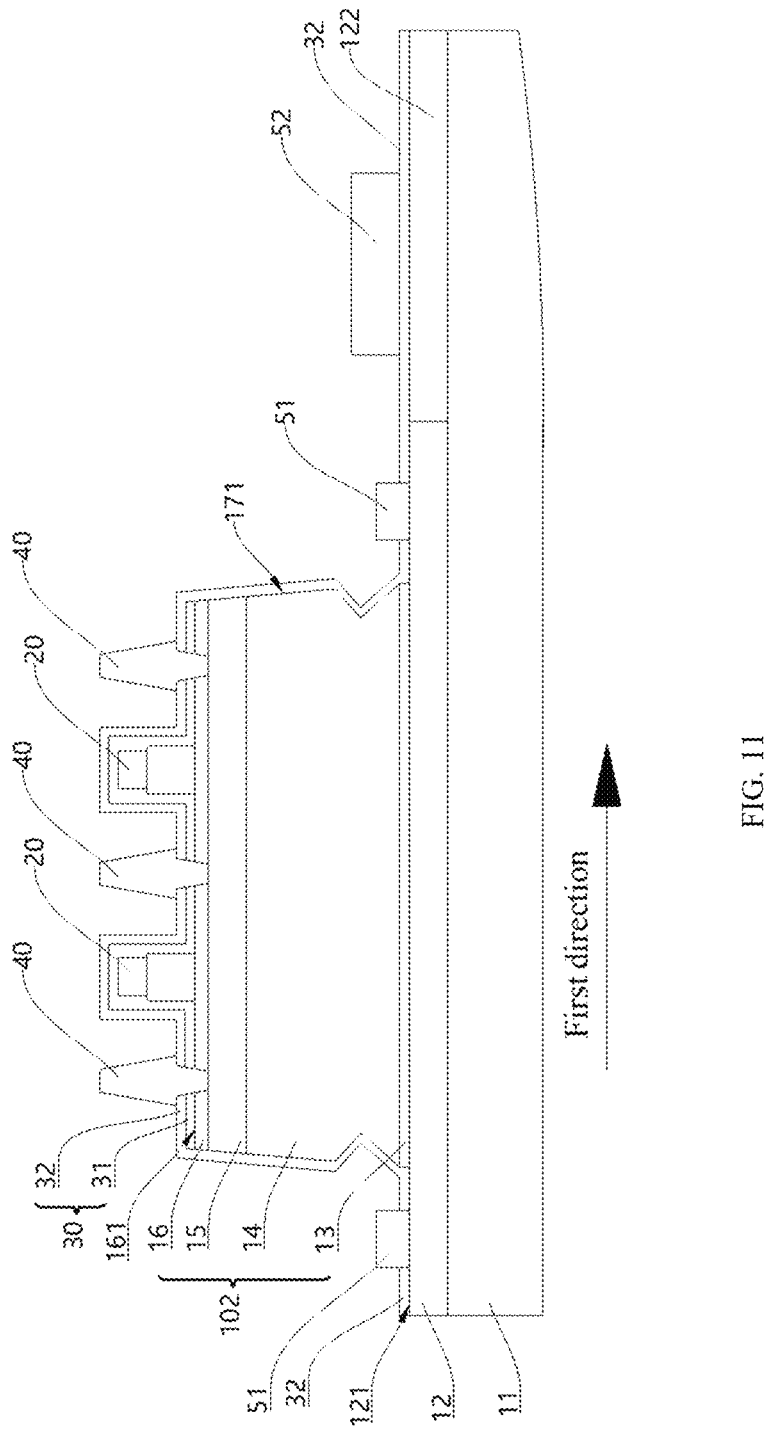
FIG. 11 illustrates a schematic structural diagram after a collector electrode and a capacitor metal are formed using the structure shown in FIG. 10.
Figure 12:
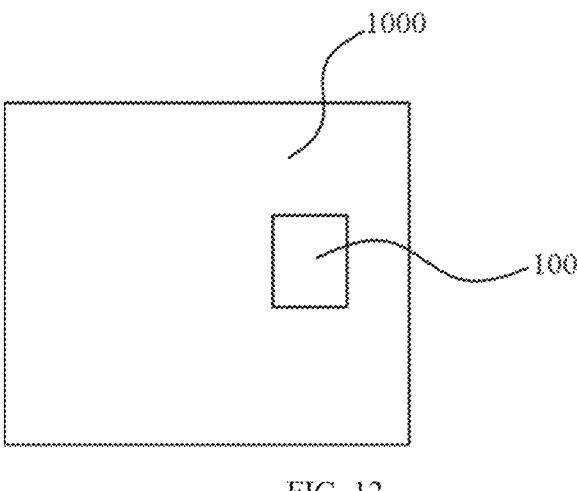
FIG. 12 illustrates a schematic structural diagram of a radio frequency amplifier according to an embodiment of the disclosure.

After step S3 is completed, the photoresist is removed to obtain a structure as shown in FIG. 10 (corresponding to the A-A cross-sectional view).

Next, the step S4 is performed, a first metal material is deposited on the second dielectric layer 32 using the photomask and photoresist to achieve the pattern transfer. A part of the first metal material is located in the active area and connected to the subcollector layer 12 through the third opening 322 to form a collector electrode 51, and the other part of the first metal material is located in the passive area 122 and isolated from the subcollector layer 12 through the second dielectric layer 32 to form a capacitor metal 52 (refer to FIG. 11, corresponding to the A-A cross-sectional view).

The first metal material, for example, may be a AuGe/Ni/Au or Au/Ge/Ni/Au structure.

The capacitor metal 52 is located on the passive region 122. The capacitor metal 52 can be used as a capacitor bottom plate of a passive device, such as a stack capacitor. In the related art, the capacitor bottom plate directly contacts the semiconductor material. During the subsequent high-temperature treatment, a bottom surface of the capacitor bottom plate in contact with the semiconductor material will become uneven, resulting in a decrease in device reliability.

In the embodiment, the capacitor metal 52 is disposed on the second dielectric layer 32, which remains flat after the capacitor metal 52 is subjected to the high-temperature treatment, so as to improve the reliability of the capacitor.

After step S5, for example, it further includes a step S6, a third dielectric layer 33 is formed, and the third dielectric layer 33 covers the second dielectric layer 32 and covers the base electrode 40. Referring to FIG. 2, after the third dielectric layer 33 is formed on the second dielectric layer 32, the third dielectric layer 33 also covers the collector electrode 51 and the capacitor metal 52. The third dielectric layer 33 covers the second dielectric layer 32, thus the third dielectric layer 33 also covers the emitter electrode 22. The third dielectric layer 33 can be used for more comprehensive protection. When the wiring metal is subsequently prepared, a corresponding position of the third dielectric layer 33 can be opened to achieve the connection of the corresponding wiring metal with the base electrode 40, the collector electrode 51 and the emitter electrode 22. The material of the third dielectric layer 33 can be the same as or different from the material of the second dielectric layer 32, and the thickness of the third dielectric layer 33 can be the same as or different from the thickness of the second dielectric layer 32.

The semiconductor device 100 and the preparation method of the semiconductor device provided by the embodiment of the disclosure can reduce the device area, reduce the area of the BC junction, and reduce the resistance of the base electrode 40 while maintaining the appropriate effective spacing between the base electrode 40 and the emitter mesa 21 through the design of the base electrode 40. The PN junction volume can be reduced by the recessed portion 1711. The emitter layer 16 can be protected by the first dielectric layer 31 to improve reliability, and the effect of reducing the BC junction capacitance of the device can be achieved through the comprehensive design, thereby improving the frequency characteristics of the device.

In some embodiments, the embodiments of the disclosure further provide a radio frequency amplifier 1000, the radio frequency amplifier 1000 includes any of the aforementioned semiconductor devices 100, or the radio frequency amplifier 1000 includes a semiconductor device prepared by any of the aforementioned preparation methods. The radio frequency amplifier 1000 has the same effect as the semiconductor device, which will not be described in detail here.

The above description is merely some of the embodiments of the disclosure and does not limit the disclosure in any form. Although the disclosure has been disclosed as the above embodiments, it is not used to limit the disclosure. Any those skilled in the art can make some changes or modifications to equivalent embodiments of equivalent changes using the technical contents disclosed above without departing from the scope of the technical solution of the disclosure. However, any simple modification, equivalent change and modification made to the above embodiments based on the technical essence of the disclosure without departing from the content of the technical solution of the disclosure still fall within the scope of the technical solution of the disclosure.

What is claimed is:

1. A semiconductor device, comprising: an active region, wherein the active region comprises:

a semiconductor layer, having a first surface, wherein the semiconductor layer comprises a collector layer, a base layer and an emitter layer sequentially stacked in that order; and the first surface is a surface of the emitter layer facing away from the base layer;

an emitter mesa, disposed on the emitter layer;

an emitter electrode, disposed on the emitter mesa;

a first dielectric layer, covering a top surface of the emitter electrode, and extending along a side surface of the emitter electrode to cover a part of the first surface exposed outside the emitter electrode; wherein the first dielectric layer defines a first opening;

a second dielectric layer, covering the first dielectric layer; wherein the second dielectric layer defines a second opening connected to the first opening; and a base electrode, connected to the base layer through the first opening and the second opening, and extending laterally to directly cover at least a part of an upper surface of the second dielectric layer adjacent to the second opening; and wherein a thickness of each of the first dielectric layer and the second dielectric layer is in a range of 200 angstroms (Å) to 1000 Å; a maximum width of the first opening is in a range of 0.2 microns ($\mu$m) to 1 $\mu$m, and a maximum width of the second opening is in a range of 0.2 $\mu$m to 1 $\mu$m; and a minimum distance between the first opening and the emitter mesa is in a range of 0.2 $\mu$m to 1 $\mu$m.

2. The semiconductor device as claimed in claim 1, wherein the semiconductor layer further has a semiconductor side surface adjacent to the first surface; and the second dielectric layer further covers the semiconductor side surface.

3. The semiconductor device as claimed in claim 2, further comprising: a third dielectric layer, wherein the third dielectric layer covers the second dielectric layer and covers the base electrode.

4. The semiconductor device as claimed in claim 1, wherein a tilt angle of a sidewall of the first dielectric layer facing towards the first opening is less than or equal to 90°, and a tilt angle of a sidewall of the second dielectric layer facing towards the second opening is less than or equal to 90°.

5. The semiconductor device as claimed in claim 1, wherein a thickness of the base electrode is in a range of 1000 Å to 10000 Å.

6. The semiconductor device as claimed in claim 2, wherein the semiconductor side surface comprises two first side surfaces opposite to each other in a first direction and two second side surfaces opposite to each other in a second direction, the first direction is intersected with the second direction, and each of the two first side surfaces defines a recessed portion located on the collector layer.

7. The semiconductor device as claimed in claim 6, wherein each of the two second side surfaces defines a step portion.

8. The semiconductor device as claimed in claim 3, wherein the semiconductor layer further comprises a subcollector layer located on a side of the collector layer facing away from the base layer, the semiconductor layer further has a second surface, and the second surface is a surface of the subcollector layer facing towards the collector layer and exposed outside the collector layer; the second dielectric layer further covers the second surface; an area of the second dielectric layer located on the second surface defines a third opening; and the semiconductor layer further comprises a collector electrode, the collector electrode is connected to the subcollector layer through the third opening, and the third dielectric layer further covers the collector electrode.

9. The semiconductor device as claimed in claim 8, further comprising a passive region, the passive region and the active region are configured to share the subcollector layer; and the semiconductor device further comprises a capacitor metal disposed on the passive region, the capacitor metal is disposed on the second dielectric layer, and the third dielectric layer further covers the capacitor metal.

10. A radio frequency amplifier, comprising the semiconductor device as claimed in claim 1.

11. The semiconductor device as claimed in claim 8, wherein the second dielectric layer does not cover an upper surface of the collector electrode, and the third dielectric layer completely covers the upper surface of the collector electrode.

* * * * *